United States Patent
Sugimoto et al.

(10) Patent No.: US 8,097,816 B2
(45) Date of Patent: Jan. 17, 2012

(54) ELECTRONIC DEVICE AND METHOD OF PRODUCING THE SAME

(75) Inventors: Keiichi Sugimoto, Kariya (JP); Mitsuru Nakagawa, Chiryu (JP)

(73) Assignee: Denso Corporation, Kariya (JP)

( * ) Notice: Subject to any disclaimer, the term of this patent is extended or adjusted under 35 U.S.C. 154(b) by 181 days.

(21) Appl. No.: 12/661,494

(22) Filed: Mar. 18, 2010

(65) Prior Publication Data

US 2010/0246146 A1     Sep. 30, 2010

(30) Foreign Application Priority Data

Mar. 25, 2009   (JP) ................. 2009-075025

(51) Int. Cl.
   *H01L 23/28*   (2006.01)
(52) U.S. Cl. ........ 174/521; 361/728; 361/748; 361/737; 361/750; 29/841
(58) Field of Classification Search .......... 174/520–524, 174/550; 361/757, 728, 737, 739, 764, 748–750, 361/760–762; 29/830, 832, 833, 840, 841, 29/852
See application file for complete search history.

(56) References Cited

U.S. PATENT DOCUMENTS

| 4,575,621 | A | * | 3/1986 | Dreifus .......................... 235/380 |
| 4,686,358 | A | * | 8/1987 | Seckinger et al. ............ 235/382 |
| 4,974,120 | A | * | 11/1990 | Kodai et al. .................... 361/737 |
| 5,013,900 | A | * | 5/1991 | Hoppe ........................... 235/492 |
| 5,677,568 | A | * | 10/1997 | Ochi et al. ..................... 257/679 |
| 2006/0252384 | A1 | | 11/2006 | Sugimoto et al. |
| 2009/0086445 | A1 | | 4/2009 | Sugimoto et al. |
| 2009/0086446 | A1 | | 4/2009 | Sugimoto et al. |
| 2009/0086447 | A1 | | 4/2009 | Sugimoto et al. |

FOREIGN PATENT DOCUMENTS

JP    5-337979    12/1993

OTHER PUBLICATIONS

U.S. Appl. No. 12/661,497, filed Mar. 18, 2010, Sugimoto et al.

* cited by examiner

*Primary Examiner* — Hoa C Nguyen

(74) *Attorney, Agent, or Firm* — Harness, Dickey & Pierce, PLC

(57) ABSTRACT

A method of producing an electronic device includes a holding of a circuit board and a decoration sheet in a cavity of a mold, and a filling and solidifying of thermosetting resin in the cavity. A casing is molded by the solidified thermosetting resin so as to seal electronic parts and a first face of the circuit board having the electronic parts. Further, the decoration sheet is integrated with the casing by the solidified thermosetting resin. An outer surface of the casing is defined by a second face of the circuit board opposite from the first face and the decoration sheet.

10 Claims, 3 Drawing Sheets

ELECTRONIC DEVICE AND METHOD OF PRODUCING THE SAME

CROSS REFERENCE TO RELATED APPLICATION

This application is based on Japanese Patent Application No. 2009-75025 filed on Mar. 25, 2009, the disclosure of which is incorporated herein by reference in its entirety.

BACKGROUND OF THE INVENTION

1. Field of the Invention

The present invention relates to an electronic device and a method of producing the electronic device.

2. Description of Related Art

JP-A-2006-303327 discloses a method of producing an electronic device. Electronic parts are mounted on only a first face of a circuit board, and the circuit board is arranged in a cavity of a mold in a manner that a second face of the circuit board opposite from the first face is tightly contact with an inner wall face of the mold. Further, thermosetting resin is filled in the cavity, and the filled resin is hardened. Thus, a casing is molded by the hardened resin, and the second face of the circuit board defines an outer surface of the electronic device.

While the casing is molded, only the first face of the circuit board is pressed by the thermosetting resin, and the circuit board is pressed onto the mold. At this time, the second face of the circuit board is tightly contact with the inner wall face of the mold. Therefore, the circuit board can be restricted from having a deformation, and connection reliability of the electronic parts can be maintained.

The electronic device has an outer surface defined by the casing and the second face of the circuit board. When a design property of the electronic device is required to be raised, the inner wall face of the mold is processed to have a grain. Alternatively, a face of the casing is coated with paint, after the casing is molded.

However, a pattern of the grain is limited, and a coloring cannot be performed by the processing of the grain. Further, when the coating of the casing is performed by spraying paint, a defective paint is easily generated, and a yield is low. Thus, cost of producing the electronic device may be increased. Further, when the casing is required to have multiple-coloring, the number of processes is increased, such that the cost may be further increased.

SUMMARY OF THE INVENTION

In view of the foregoing and other problems, it is an object of the present invention to provide an electronic device and a method of producing the electronic device.

According to a first example of the present invention, a method of producing an electronic device includes a mounting of electronic parts on only a first face of a circuit board. The producing method further includes a holding of the circuit board in a cavity of a mold, in a manner that a second face of the circuit board opposite from the first face is tightly contact with a first inner face of the mold opposing to the second face of the circuit board. The producing method further includes a holding of a decoration sheet between the first face of the circuit board and a second inner face of the mold opposing to the first face of the circuit board. The decoration sheet has a transparent base made of thermoplastic resin and a decoration layer layered on the base. The decoration layer opposes to the first face of the circuit board. The producing method further includes a filling of thermosetting resin into the cavity, and a solidifying of the filled resin. Therefore, a casing is molded by the solidified resin so as to seal the electronic parts and the first face of the circuit board, in a manner that the second face of the circuit board defines a part of an outer surface of the casing. The solidifying of the filled resin integrates the decoration sheet and the casing, such that the decoration sheet defines a part of the outer surface of the casing.

According to a second example of the present invention, an electronic device includes a circuit board, electronic parts, a casing, and a decoration sheet. The circuit board has a first face and a second face opposite from each other, and the electronic parts are mounted on only the first face of the circuit board. The casing seals the first face of the circuit board and the electronic parts, and is made of thermosetting resin. The decoration sheet is integrated with the casing. The decoration sheet has a transparent base made of thermoplastic resin, and a decoration layer layered on a first face of the base. The base has a second face opposite from the first face. The casing has an outer surface, and a part of the outer surface is defined by the second face of the circuit board and the second face of the base.

Accordingly, a design property of the electronic device can be increased with a low cost.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF PREFERRED EMBODIMENT

An electronic device is an electronic key system used for a vehicle, for example. Specifically, the electronic device is an electronic key corresponding to a mobile two-way transmitter used for a smart entry system.

Figure 1:
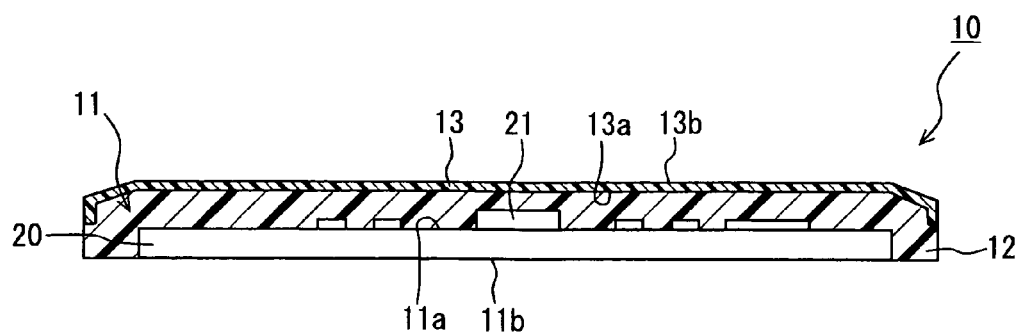
FIG. 1 is a schematic cross-sectional view illustrating an electronic key according to an embodiment.

As shown in FIG. 1, an electronic key 10 includes a circuit board 11, a casing 12, and a decoration sheet 13. The circuit board 11 has a top face 11a and a back face 11b, and electronic parts 21 are arranged only on the top face 11a of the circuit board 11. The top face 11a of the circuit board 11 and The electronic parts 21 are sealed by the casing 12 made of resin. The decoration sheet 13 is integrated with a surface of the casing 12 by using an in-mold molding.

Figure 2:
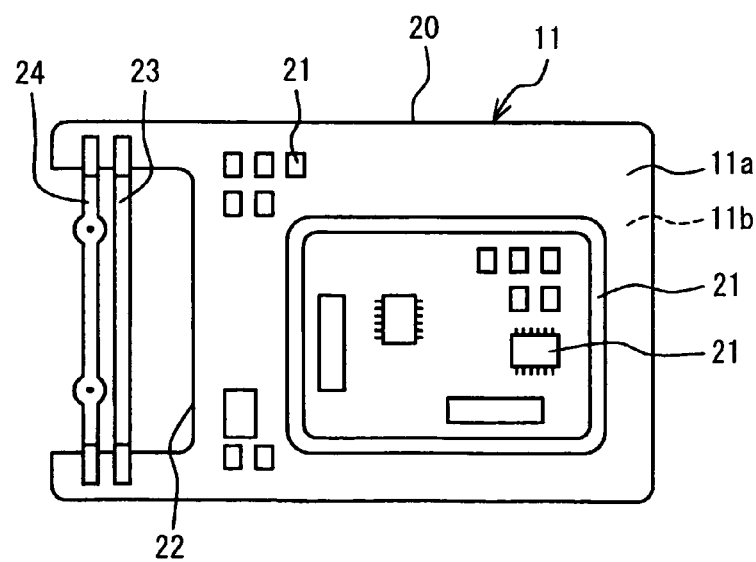
FIG. 2 is a schematic plan view illustrating a circuit board of the electronic key.

As shown in FIG. 2, the circuit board 11 has a wiring board 20 and terminals 23, 24. The electronic parts 21 are mounted on the wiring board 20. The wiring board 20 is made of an insulating material such as glass epoxy resin, and has a wiring pattern made of copper foil, for example. Further, the insulating material may be glass-fiber-reinforced epoxy resin.

Alternatively, the insulating material may be synthetic resin or ceramic. Further, the wiring pattern has at least one layer, and the number of the layers is not limited.

The wiring board 20 has land (not shown) on the top face 11a as a part of the wiring pattern, and the electronic parts 21 are soldered on the land. The electronic parts 21 are mounted on only the top face 11a, because the electronic parts 21 are not mounted on the back face 11b of the circuit board 11. The electronic parts 21 may be resistor, capacitor, diode, transistor, IC and antenna.

The wiring board 20 has a cutout 22, and a space accommodating a battery is defined by the cutout 22. The anode and cathode terminals 23, 24 are mounted on the wiring board 20. The anode terminal 23 is configured to contact with an anode pole of the battery, and the cathode terminal 24 is configured to contact with a cathode pole of the battery.

Specifically, as shown on a left side of FIG. 2, the wiring board 20 has a U-shape open leftward. A part of an end portion of the rectangular wiring board 20 in a longitudinal direction is removed in an approximately center area in a direction perpendicular to the longitudinal direction. The removed part corresponds to the battery-accommodating space, and passes through the top face 11a and the back face 11b in a thickness direction of the circuit board 11. An edge of the removed part defines the cutout 22, and has the U-shape.

The terminals 23, 24 oppose to the battery-accommodating space, and are arranged to be a bridge connecting end portions of the U-shape. Ends of the terminal 23, 24 are soldered on the land.

The casing 12 is formed by filling thermosetting resin in a cavity of a mold, and by hardening the filled resin. The casing 12 seals the top face 11a of the circuit board 11 and the electronic parts 21, and the back face 11b of the circuit board 11 covers a part of an outer surface of the casing 12 of the electronic key 10.

The casing 12 is formed by using a transfer molding, for example, and the transfer molding is known as being used for sealing a semiconductor package. A viscosity of melted thermosetting resin is typically lower than that of melted thermoplastic resin. Therefore, a pressure for filling the thermosetting resin in the transfer molding can be made lower, compared with a pressure for filling the thermoplastic resin in an injection molding.

That is, a speed of the thermosetting resin flowing into the cavity is slow, compared with the thermoplastic resin. Further, a temperature for hardening the thermosetting resin is low, compared with a temperature for melting the thermoplastic resin in the injection molding. Therefore, the transfer molding is suitable for sealing the circuit board 11 to which the electronic parts 21 are soldered.

As shown in FIG. 1, the casing 12 further seals side faces of the circuit board 11 other than the top face 11a. An outer shape of the casing 12 is made into an approximately card shape. For example, outer dimensions of the casing 12 are approximately equal to outer dimensions of ID-1 type card such as a normal credit card.

The casing 12 is made of thermosetting resin having a hardening temperature $T2$. The hardening temperature $T2$ is lower than a melting temperature $T1$ of a solder used for mounting the electronic parts 21 ($T1>T2$). A difference between the resin hardening temperature $T2$ and the solder melting temperature $T1$ may be made larger.

For example, the casing 12 is made of epoxy resin having the hardening temperature $T2$ of 170° C., which is sufficiently lower than the solder melting temperature $T1$ of 240° C. Therefore, the solder can be restricted from melting while the casing 12 is formed.

The epoxy resin has a high heat-resisting property and a high mechanical strength. Therefore, a reliability of the electronic key 10 can be raised by using the epoxy resin for the casing 12 of the electronic key 10, in a case when the electronic key 10 is always carried by a person.

Alternatively, the casing 12 may be made of other thermosetting resin such as phenol resin or unsaturated polyester resin. In this case, the relationship of $T1>T2$ is necessary.

The decoration sheet 13 includes a transparent base made of thermoplastic resin, and a decoration layer layered on the transparent base. A first face 13a of the decoration sheet 13 is tightly contact with a surface of the casing 12 in a thickness direction. The decoration layer is located adjacent to the first face 13a.

The decoration sheet 13 is integrated with the surface of the casing 12 by an in-mold molding, such that a second face 13b of the decoration sheet 13 opposite from the first face 13a defines a part of the outer surface of the electronic key 10. The transparent base is located adjacent to the second face 13b. Thus, the outer surface of the electronic key 10 is defined by the back face 11b of the circuit board 11, a part of the casing 12, and the second face 13b of the decoration sheet 13.

The transparent base holds and protects the decoration layer. The decoration layer can be seen from outside, because the transparent base is made of transparent thermoplastic resin. For example, the transparent base may be made of polycarbonate (PC). Alternatively, the transparent base may be made of poly-ethylene-terephthalate (PET) or polyimide (PI).

The decoration layer provides a decoration or functionality relative to the outer surface of the electronic key 10, so as to improve a design property of the electronic key 10. The decoration layer is formed by performing a screen-printing, vapor deposition or paint-coating relative to a face of the transparent base having a sheet shape or a film shape. The decoration layer is located on at least a part of the transparent base contacting with the casing 12. The decoration layer is formed to have a predetermined design in a predetermined color by a screen-printing, for example.

The decoration sheet 13 may further include other layer other than the transparent base and the decoration layer. For example, the decoration sheet 13 may further include an adhesion layer layered on the decoration layer. In this embodiment, the decoration sheet 13 does not include an adhesion layer, because the epoxy resin used for forming the casing 12 has an adhesion property.

Figure 3:
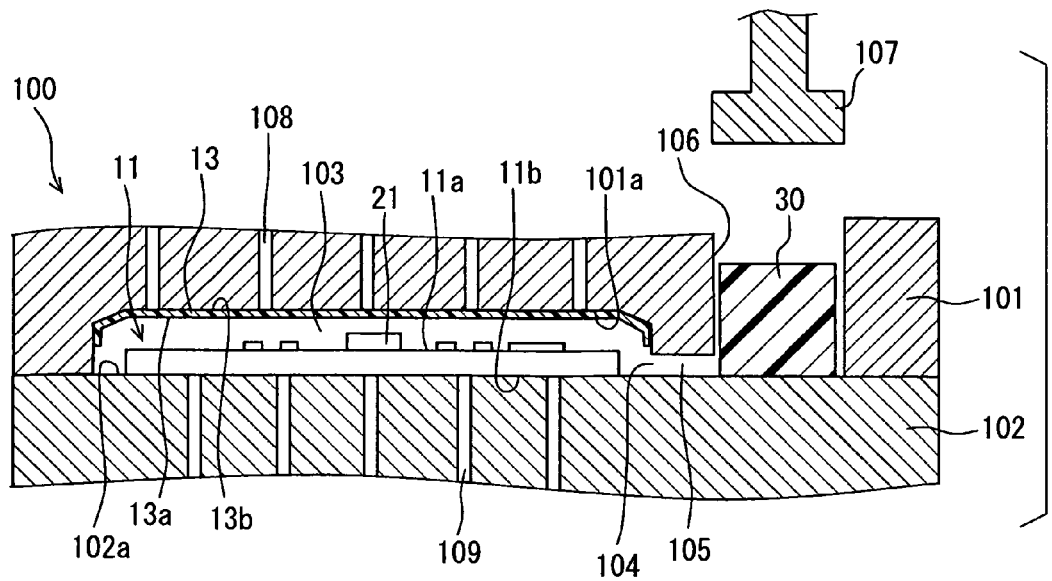
FIG. 3 is a cross-sectional view illustrating a holding process of a method of producing the electronic key.

A method of producing the electronic key 10 will be described. As shown in FIG. 3, the circuit board 11 is prepared, to which the electronic parts 21 and the terminals 23, 24 are mounted by soldering in advance. Further, the decoration sheet 13 is prepared. The decoration sheet 13 is processed to have a predetermined shape corresponding to a lower face 101a of an upper mold 101 in advance. The lower face 101a is to be an inner face of a cavity 103 of a mold 100 while a molding of the casing 12 is performed.

A method of forming the decoration sheet 13 will be briefly described. A preliminary forming process of the decoration sheet 13 is performed by a pneumatic forming, vacuum forming or press forming, for example. In this embodiment, a screen printing is performed on the transparent base made of polycarbonate so as to form the decoration layer, and the decoration sheet 13 is formed by the pneumatic forming.

Specifically, an edge of the decoration sheet 13 is clamped, and the decoration sheet 13 is heated to be soft. The softened sheet 13 is made to tightly contact with the lower face 101a of the upper mold 101 by compressed air. After the preliminary forming process is finished, an unnecessary part for the electronic key 10 is removed. The unnecessary part may be removed with a cull and a runner after a molding of the casing 12 is finished.

As shown in FIG. 3, the back face 11b of the circuit board 11 is held to be tightly contact with an upper face 102a of a lower mold 102. The upper face 102a is to be an inner face of the cavity 103 while a molding of the casing 12 is performed. The first face 13a of the decoration sheet 13 is made to oppose to the top face 11a of the circuit board 11. The second face 13b of the decoration sheet 13 is made to be tightly contact with the lower face 101a of the upper mold 101.

The mold 100 has the upper mold 101, the lower mold 102 and a slide core (not shown). The upper mold 101 is arranged on an upper side in a thickness direction of the circuit board 11, and the lower mold 102 is arranged on a lower side in the thickness direction of the circuit board 11. The slide core is used for forming the battery-accommodating space by covering a center part of the terminal 23, 24. The mold 101, 102 has a fixed board (not shown) or a movable board (not shown), and is fixed on a platen of a molding machine (not shown).

As shown in FIG. 3, the upper mold 101 has a sprue 105 corresponding to a passage for supplying resin into the cavity 103 through a gate 104. The sprue 105 may correspond to a runner. A pot 106 is arranged on an upstream side of the sprue 105, and extends in the thickness direction. Resin is input through the pot 106. A piston plunger 107 is arranged above the pot 106, and is movable into the pot 106 through a hole of the platen (not shown).

The upper mold 101 further has a suction hole 108 through which the decoration sheet 13 set in the cavity 103 is sucked and held by a negative pressure. The suction hole 108 is connected to a vacuum pump (not shown) through a pipe (not shown). A pressure of the suction hole 108 is controlled to be negative, if necessary.

The lower mold 102 has a suction hole 109 through which the circuit board 11 set in the cavity 103 is sucked and held by a negative pressure. The suction hole 109 is connected to a vacuum pump (not shown) through a pipe (not shown). A pressure of the suction hole 109 is controlled to be negative, if necessary.

The upper mold 101 and the lower mold 102 are separated from each other before a molding is performed. In this state, the circuit board 11 is arranged at a predetermined position in a manner that all the back face 11b contacts the upper face 102a of the lower mold 102. The upper face 102a is to be an inner face of the cavity 103 during the molding. The decoration sheet 13 is arranged at a predetermined position in a manner that all the second face 13b contacts the lower face 101a of the upper mold 101. The lower face 101a is to be an inner face of the cavity 103 during the molding.

At this time, the suction hole 108 is made to have a negative pressure, thereby a force is applied to the decoration sheet 13 upward. Thus, the decoration sheet 13 completely contacts with the lower face 101a of the upper mold 101. Similarly, the suction hole 109 is made to have a negative pressure, thereby a force is applied to the circuit board 11 downward. Thus, the circuit board 11 completely contacts with the upper face 102a of the lower mold 102. The upper mold 101 and the lower mold 102 are tightened with each other while the contact states are maintained.

As shown in FIG. 3, a tablet 30 made of resin material used for the transfer molding is input in the pot 106 through an upper opening, when the mold 100 is tightened such that the circuit board 11 and the decoration sheet 13 are held in the cavity 103.

The resin material is made of thermosetting resin such as epoxy resin, in this embodiment. Specifically, filler such as silica and a hardening agent are added into the epoxy resin. Further, catalyst such as hardening promoting agent, and mold-releasing agent are suitably added into the epoxy resin. The tablet 30 is produced by solidifying epoxy resin having B-stage particles in advance. Due to the tablet 30, operation can be easily performed, and air can be prevented from mixing into the casing 12. The tablet 30 is input into the pot 106 after heated, if necessary.

At this time, a temperature of the mold 100 is made to be suitable for hardening the thermosetting resin. The circuit board 11 is arranged in the cavity 103 during the molding of the casing 12, and the electronic parts 21 and the terminals 23, 24 are soldered on the circuit board 11. The solder is required to be restricted from melting during the molding of the casing 12. Therefore, the temperature of the mold 100 is set sufficiently high for hardening the thermosetting resin, and is set sufficiently low for restricting the melting of the solder.

Figure 4:
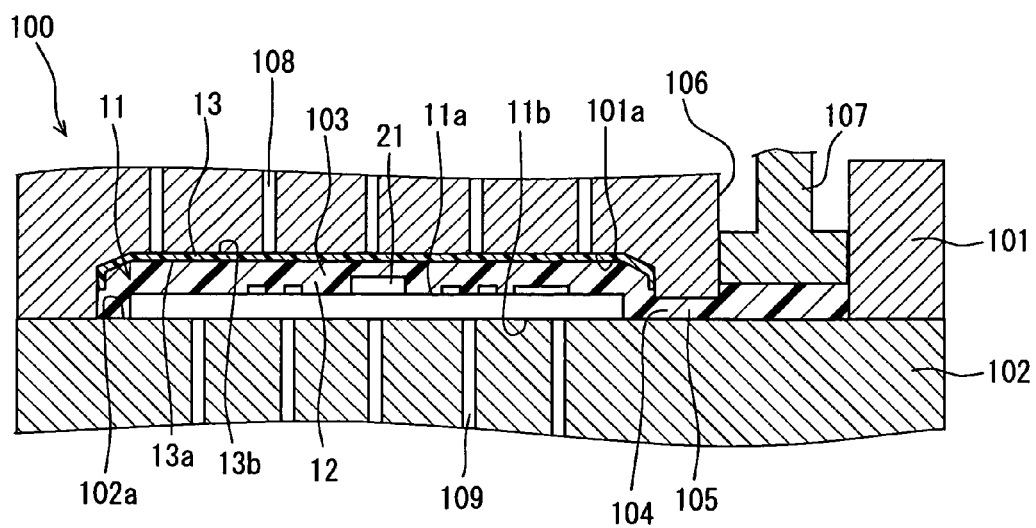
FIG. 4 is a cross-sectional view illustrating a molding process of the method of producing the electronic key.

As shown in FIG. 4, the plunger 107 is lowered into the pot 106, and the tablet 30 is softened to have a liquid state. The liquid resin is filled in the cavity 103 through the sprue 105 and the gate 104. The liquid resin filled in the cavity 103 receives heat from the mold 100, so as to have polymerization. Thus, the liquid resin is solidified, such that the casing 12 can be formed.

When the liquid resin is filled in the cavity 103, the liquid resin tightly contacts with the first face 13a of the decoration sheet 13. When the liquid resin is solidified, a strong adhesion can be provided between the casing 12 and the first face 13a of the decoration sheet 13. That is, the casing 12 is integrated with the decoration sheet 13, while the casing 12 is molded, such that the decoration sheet 13 forms a part of the outer surface of the electronic key 10.

According to the embodiment, the temperature of the mold 100 is set approximately equal to a temperature for hardening the epoxy resin, for example, 170° C.-180° C., because the epoxy resin has the hardening temperature of 170° C. In contrast, the solder has the melting temperature of 240° C. The temperature of the mold 100 is set lower than a temperature for melting the decoration sheet 13 made of thermoplastic resin. Further, the temperature of the mold 100 is set-lower than a temperature for softening the transparent base of the decoration sheet 13.

That is, the temperature of the mold 100 is sufficiently lower than the melting temperature of the thermoplastic resin, compared with a case in which an injection molding is performed by the thermoplastic resin. Therefore, even when the decoration sheet 13 receives heat from the mold 100, the transparent base of the decoration sheet 13 may be softened, but is not melted. The decoration sheet 13 is tightly contact with the lower face 101a of the upper mold 101, and the shape of the sheet 13 is maintained while the molding of the casing 12 is performed. Further, crack is not generated in the decoration layer of the decoration sheet 13.

It takes about 20-seconds to fill the liquid thermosetting resin into the cavity 103. In contrast, in an injection molding using thermoplastic resin, it takes about 5-seconds to fill the liquid thermoplastic resin into a cavity so as to form a casing having the same construction. Thus, a speed of resin flowing into the cavity 103 can be slow in this embodiment. Therefore, a deformation of the pattern of the decoration layer is not generated, which may be easily generated in the injection molding having a higher resin flowing speed.

After the molding of the casing 12 is finished, the upper mold 101 and the lower mold 102 are made separated from each other. When an ejector device (not shown) is activated, the casing 12 is separated from the mold 100. The casing 12 is molded in a state that the circuit board 11 is arranged in the casing 12, and in a state that the decoration sheet 13 is integrated with the casing 12. At this time, the casing 12 has unnecessary resin solidified in the sprue 105 corresponding to the runner, and a cull of resin solidified in the pot 106. The cull and the runner are removed by cutting at a position corresponding to the gate 104.

All the electronic parts 21, the top face 11a and the side faces of the circuit board 11, and a part of the terminal 23, 24 are sealed by the resin material. That is, the circuit board 11 and its adjacent part are sealed by the resin material. The back face 11b of the circuit board 11 is exposed from the casing 12. Specifically, the surface of the casing 12 defining the outer surface of the electronic key 10, and the back face 11b of the circuit board 11 are smoothly connected with each other, so as to form the same plane.

The top face 11a of the circuit board 11, the electronic parts 21 mounted on the circuit board 11, and the terminals 23, 24 to be connected to outside are completely buried and sealed in the resin forming the casing 12. Therefore, electronic circuit in the casing 12 is completely closed, except for the terminals 23, 24 opposing to the battery-accommodating space, such that the electronic key 10 can have a waterproof structure.

As shown in FIG. 1, the casing 12 has a first lower face forming the same plane as the back face 11b of the circuit board 11, a second lower face contacting with the top face 11a of the circuit board 11, an upper face opposing to the top face 11a of the circuit board 11, and a side face opposing to the side face of the circuit board 11.

The decoration sheet 13 is integrally arranged on all the top face and a part of the side face of the casing 12. The decoration sheet 13 is not arranged on the first and second lower faces of the casing 12. An edge of the decoration sheet 13, and the side face of the casing 12 defining the outer surface of the electronic key 10 are smoothly connected with each other so as to form the same plane.

The circuit board 11 is buried in the casing 12, and the casing 12 has an exposed face not cover by the circuit board 11. The exposed face of the casing 12 and the back face 11b of the circuit board 11 are arranged on the same plane. The casing 12 has a side face approximately perpendicular to the circuit board 11. A part of the side face of the casing 12 is covered by the decoration sheet 13, and the other part of the side face of the casing 12 is exposed outside.

The polymerization of the epoxy resin may be completed after the molding of the casing 12 is finished, if necessary. The casing 12 is heated for a predetermined period at a temperature sufficiently lower than the melting temperature of the solder and the transparent base of the decoration sheet 13. Thus, the thermosetting resin can be further hardened.

Advantages of the method of producing the electronic key 10 will be described. The electronic parts 21 are mounted on only the first face 11a of the circuit board 11, and the back face 11b of the circuit board 11 is lightly contact with the upper face 102a of the lower mold 102. In this state, liquid epoxy resin is filled in the cavity 103, and the filled resin is solidified.

Therefore, a pressure generated from the epoxy resin is applied to only the top face 11a of the circuit board 11, such that the circuit board 11 is pressed onto the lower mold 102. At this time, the circuit board 11 is supported by the lower mold 102 in a manner that all the back face 11b is tightly contact with the upper face 102a of the lower mold 102. Therefore, the circuit board 11 can be restricted from having a deformation. Further, connection reliability of the electronic parts 21 can be restricted from being lowered at the resin-filling time and the resin-hardening time.

The base of the decoration sheet 13 made of thermoplastic resin is softened by heat generated when the casing 12 is molded. Therefore, the decoration sheet 13 can be integrated with the surface of the casing 12 while the molding of the casing 12 is performed. That is, the surface of the casing 12 is decorated with the decoration sheet 13, when the molding of the casing 12 is finished. Therefore, a process for decorating the casing 12 of the electronic key 10 can be eliminated, such that cost of producing the electronic key 10 can be reduced.

The decoration layer of the decoration sheet 13 is made to have a pattern or letters by a printing or vapor deposition. Due to the decoration sheet 13, a design of the electronic key 10 can be flexibly changed. Thus, design property of the electronic key 10 can be raised, compared with a case in which a casing is processed to have a grain.

According to the embodiment, the circuit board 11 can be restricted from having a deformation, and connection reliability of the electronic parts 21 can be restricted from being lowered. Further, the design property of the electronic key 10 can be raised with a relatively low cost.

The casing 12 is formed by molding thermosetting resin such as epoxy resin, and the decoration sheet 13 is integrated with the casing 12. A temperature for molding the thermosetting resin is lower than a temperature for molding a thermoplastic resin. A speed of the thermosetting resin flowing into the cavity 103 is slower than a flowing speed of the thermoplastic resin.

Therefore, the decoration layer can be restricted from having a crack, and the pattern of the decoration layer can be restricted form having a deformation. Further, the design of the decoration layer can be flexibly changed by a variety of processing methods, such that the design property of the electronic key 10 can be increased.

The casing 12 is formed by using the transfer molding. In this case, even when a void is generated in the casing 12, the void may be covered by the decoration sheet 13. Thus, the design property of the electronic key 10 can be raised, and a yield of the electronic key 10 can be raised, such that cost for producing the electronic key 10 can be reduced.

The shape of the decoration sheet 13 is made to correspond to the lower face 101a of the upper mold 101 in advance before the holding process. Therefore, the decoration sheet 13 can be accurately fitted to the lower face 101a of the upper mold 101 in the holding process. Thus, the design property of the electronic key 10 can be raised, and the yield of the electronic key 10 can be raised, such that cost for producing the electronic key 10 can be reduced.

Changes and modifications are to be understood as being within the scope of the present invention as defined by the appended claims.

The casing 12 is not limited to be formed by using the transfer molding. Alternatively, the casing 12 may be formed by using a compression molding.

The electronic device is not limited to the electronic key 10 corresponding to the mobile two-way transmitter used for the smart entry system. Alternatively, the electronic device may be other transmitter used for a keyless entry system, or may be other electronic device mounted on a vehicle. Further, the electronic device is not limited to be used for the vehicle.

The shape of the casing 12 of the electronic key 10 is not limited to the approximately card shape. When the casing 12 has a thin flat shape, the casing 12 is required to have a predetermined mechanical strength. In, this embodiment, the casing 12 is made of thermosetting resin, such that the casing 12 can have the predetermined mechanical strength.

The decoration sheet 13 is integrally arranged on the casing 12 opposing to all the top face 11a and a part of the side face of the circuit board 11. Alternatively, the decoration sheet 13 may be arranged on a part of the casing 12.

Figure 5:
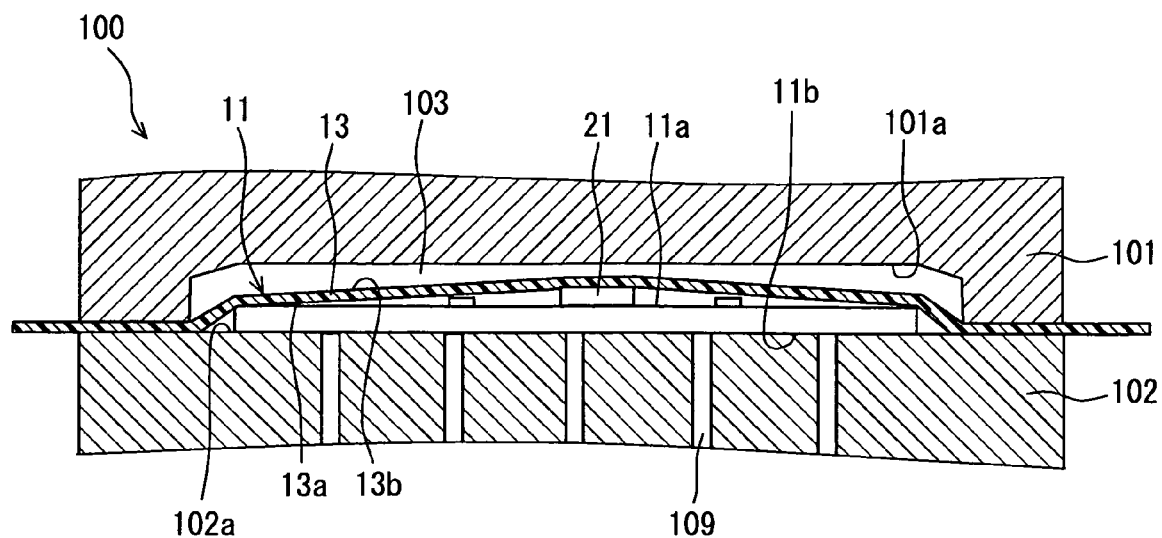
FIG. 5 is a cross-sectional view illustrating a modification of the method of producing the electronic key.

The decoration sheet 13 may not have the preliminary forming process. For example, a decoration sheet 13 not having the preliminary forming process is arranged between the top face 11a of the circuit board 11 and the lower face 101a of the upper mold 101, and the mold 100 is tightened, as shown in FIG. 5. Liquid resin is filled between the first face 13a of the decoration sheet 13 and the top face 11a of the circuit board 11.

At this time, the second face 13b of the decoration sheet 13 can be fitted to the lower face 101a of the upper mold 101 by using a pressure and a temperature generated by filling the resin. In this case, the producing process of the electronic key 10 can be simplified, because the preliminary forming process of the decoration sheet 13 is eliminated. Further, the upper mold 101 can be simplified, because the suction hole 108 is eliminated. FIG. 5 shows a modification of the producing method, in which the holding process is finished. The gate 104, the sprue 105, the pot 106, the plunger 107 and the tablet 30 exist, but are not seen in FIG. 5.

Figure 6:
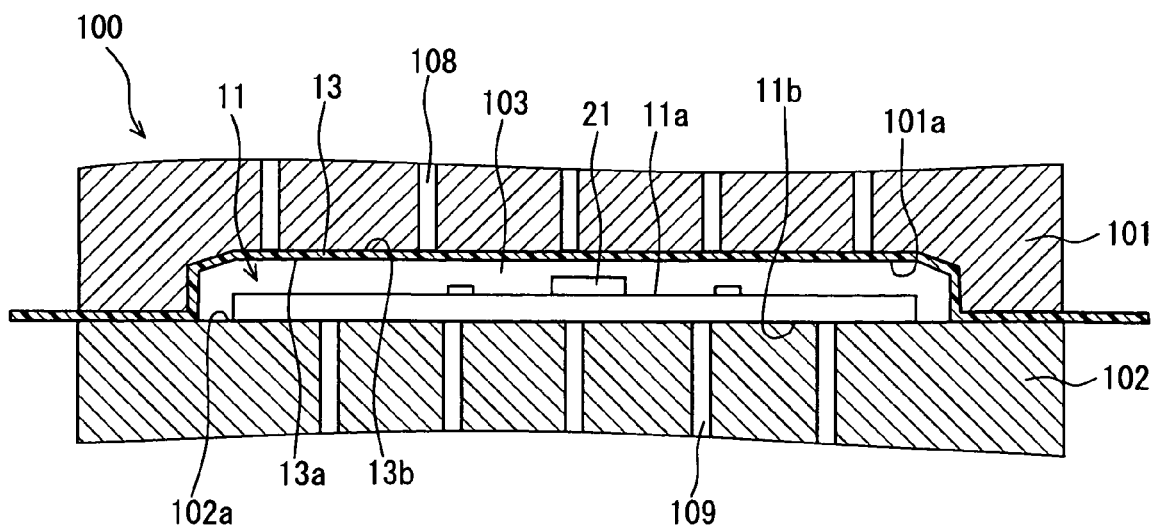
FIG. 6 is a cross-sectional view illustrating a modification of the method of producing the electronic key.

Similarly, a decoration sheet 13 not having the preliminary forming process is arranged between the top face 11a of the circuit board 11 and the lower face 101a of the upper mold 101. As shown in FIG. 6, the decoration sheet 13 is sucked by the suction hole 108, such that the second face 13b of the decoration sheet 13 is tightly contact with the lower face 101a of the upper mold 101. Liquid resin is filled in the cavity 103 in this state, and the filled resin is solidified.

In this case, the producing process of the electronic key 10 can be simplified, because the preliminary forming process of the decoration sheet 13 is eliminated. Further, due to the suction hole 108, the decoration sheet 13 can be fitted onto the lower face 101a of the upper mold 101 more securely than a case of FIG. 5. FIG. 6 shows a modification of the producing method, in which the holding process is finished. The gate 104, the sprue 105, the pot 106, the plunger 107 and the tablet 30 exist, but are not seen in FIG. 6.

What is claimed is:

1. A method of producing an electronic device comprising:
    mounting electronic parts on only a first face of a circuit board;
    holding the circuit board in a cavity of a mold in a manner that a second face of the circuit board opposite from the first face is tightly contact with a first inner face of the mold;
    holding a decoration sheet between the first face of the circuit board and a second inner face of the mold opposing to the first face of the circuit board, the decoration sheet having a transparent base made of thermoplastic resin and a decoration layer layered on the base, the decoration layer opposing to the first face of the circuit board;
    filling thermosetting resin into the cavity after the holdings of the circuit board and the decoration sheet; and
    solidifying the filled resin, such that a casing is molded by the solidified resin so as to seal the electronic parts and the first face of the circuit board in a manner that the second face of the circuit board defines a part of an outer surface of the casing, wherein
    the solidifying of the filled resin integrates the decoration sheet and the casing, such that the decoration sheet defines a part of the outer surface of the casing.

2. The producing method according to claim 1, wherein the molding of the casing is performed by using a transfer molding.

3. The producing method according to claim 1, wherein the filling of the thermosetting resin is performed in a manner that a face of the decoration sheet opposite from the decoration layer is tightly contact with the second inner face of the mold.

4. The producing method according to claim 1, wherein the holding of the decoration sheet is performed by suctioning the decoration sheet in a manner that a face of the decoration sheet opposite from the decoration layer is tightly contact with the second inner face of the mold.

5. The producing method according to claim 1, further comprising:
    forming the decoration sheet in a manner that the decoration sheet has a shape corresponding to the second inner face of the mold, wherein
    the forming of the decoration sheet is performed before the holding of the decoration sheet, and
    the holding of the decoration sheet is performed in a manner that a face of the decoration sheet opposite from the decoration layer is tightly contact with the second inner face of the mold.

6. The producing method according to claim 1, wherein the casing has an approximately card shape.

7. An electronic device comprising:
    a circuit board having a first face and a second face opposite from each other;
    electronic parts mounted on only the first face of the circuit board;
    a casing to seal the first face of the circuit board and the electronic parts, the casing being made of thermosetting resin; and
    a decoration sheet integrated with the casing, the decoration sheet having
        a transparent base made of thermoplastic resin, and
        a decoration layer layered on a first face of the transparent base, wherein
    the transparent base has a second face opposite from the decoration layer, and
    the casing has an outer surface defined by the second face of the circuit board and the second face of the transparent base.

8. The electronic device according to claim 7, wherein the casing has an approximately card shape.

9. The electronic device according to claim 7, wherein the circuit board is buried in the casing except for an area of the second face of the circuit board,
    the casing has a face exposed from the second face of the circuit board, and
    the exposed face of the casing and the second face of the circuit board are arranged on the same plane.

10. The electronic device according to claim 7, wherein the casing has a side face extending approximately perpendicular to the circuit board,
    a part of the side face of the casing is covered by the decoration sheet, and
    the other part of the side face of the casing is exposed outside.

* * * * *